(12) United States Patent
Cummings et al.

(10) Patent No.: US 10,394,998 B2
(45) Date of Patent: Aug. 27, 2019

(54) ACCELERATION OF MEMORY WALKING SEQUENCES DURING SIMULATION

(75) Inventors: David W. Cummings, Round Rock, TX (US); Douglas A. MacKay, Austin, TX (US); Vasantha R. Vuyyuru, Round Rock, TX (US)

(73) Assignee: International Business Machines Corporation, Armonk, NY (US)

( * ) Notice: Subject to any disclaimer, the term of this patent is extended or adjusted under 35 U.S.C. 154(b) by 1577 days.

(21) Appl. No.: 13/401,922

(22) Filed: Feb. 22, 2012

(65) Prior Publication Data

US 2013/0218550 A1 Aug. 22, 2013

(51) Int. Cl.
G06F 17/50 (2006.01)

(52) U.S. Cl.
CPC .................. G06F 17/5081 (2013.01)

(58) Field of Classification Search
None
See application file for complete search history.

(56) References Cited

U.S. PATENT DOCUMENTS

| | | | |
|---|---|---|---|
| 4,606,025 A * | 8/1986 | Peters | G01R 31/318342 324/73.1 |
| 5,845,106 A * | 12/1998 | Stapleton | G06F 17/5022 703/2 |
| 6,026,230 A | 2/2000 | Lin et al. | |
| 6,711,562 B1 * | 3/2004 | Ross et al. | 707/741 |
| 7,761,673 B2 | 7/2010 | Gao et al. | |
| 8,095,745 B1 * | 1/2012 | Schmidt et al. | 711/154 |
| 8,205,115 B2 | 6/2012 | Huang | |

(Continued)

FOREIGN PATENT DOCUMENTS

| | | |
|---|---|---|
| CN | 101996117 A | 3/2011 |
| CN | 101996117 B | 3/2011 |
| CN | 103324515 A | 9/2013 |

OTHER PUBLICATIONS

Cheung, E.; Hsieh, H.; Balarin, F., "Memory subsystem simulation in software TLM/T models," Design Automation Conference, 2009. ASP-DAC 2009. Asia and South Pacific, pp. 811-816, Jan. 19-22, 2009.*

(Continued)

*Primary Examiner* — Hugh M Jones
*Assistant Examiner* — Robert S Brock
(74) *Attorney, Agent, or Firm* — Bryan D. Wells

(57) ABSTRACT

Embodiments of the present invention provide a system, method, and program product for accelerating a simulated memory walking sequence during a simulation conducted by a computer. In one embodiment, a simulation test-case is executed and one or more memory locations in the simulated memory are identified as eligible to contain valid data. Subsequent to commencement of the simulated memory walking sequence, it is determined whether an identified memory location is within a specified number of memory locations after a memory location to be processed by simulated hardware during the simulated memory walking sequence. If an identified memory location is within the specified number, the simulated hardware is allowed to process the memory location. If an identified memory location is not within the specified number, the simulated hardware is advanced to a subsequent memory location and is allowed to process the subsequent memory location.

20 Claims, 6 Drawing Sheets

(56) References Cited

U.S. PATENT DOCUMENTS

| | | | | |
|---|---|---|---|---|
| 2005/0102572 | A1* | 5/2005 | Oberlaender | G06F 17/5022 714/29 |
| 2008/0126068 | A1* | 5/2008 | O'Niell et al. | 703/20 |
| 2012/0117427 | A1* | 5/2012 | Almog | G06F 11/263 714/33 |

OTHER PUBLICATIONS

Baik Song An; Ki Hwan Yum; Eun Jung Kim, "Scalable and Efficient Bounds Checking for Large-Scale CMP Environments," Parallel Architectures and Compilation Techniques (PACT), 2011 International Conference on, pp. 193-194, Oct. 10-14, 2011.*

Nakada, T.; Tsumura, T.; Nakashima, H., "Design and implementation of a workload specific simulator," Simulation Symposium, 2006. 39th Annual, 12 pages, Apr. 2-6, 2006.*

Thomas W. Barr, Alan L. Cox, Scott Rixner, Translation Caching: Skip, Don't Walk (the Page Table), ACM, ISCA'10, Jun. 19-23, 2010, Saint-Malo, France, 12 pages.*

Cheung, Chun Shing, MPSoC Simulation and Implementation of KPN Applications, UC Riverside: Computer Science, 2009, 153 pages, Retrieved from: http://escholarship.org/uc/item/78k878qt.*

Noah Deneau, Michael Haag, David Leal, and Arthur Nieuwoudt, MATCH: Memory Address Trace CacHe, Rice University—ELEC 525 Final Report, 10 pages, 2004, as retrieved from http://web.archive.org/web/20040507184725/http://www.owlnet.rice.edu/~elec525/projects/match_report.pdf Apr. 3, 2015 for archive date May 7, 2004.*

Di Carlo, Stefano, Paolo Prinetto, and Alessandro Savino. "Software-based self-test of set-associative cache memories." IEEE Transactions on Computers 60, No. 7 (published online Jun. 25, 2010): 1030-1044.*

Sood, DR RK Sharma Aditi. "Modeling and Simulation of Microcode-based Built-In Self Test for Multi-Operation Memory Test Algorithms." IJCSI International Journal of Computer Science Issues 7, No. 3 (2010): 36-40.*

Tenentes EA AL, Shrinking the Application Time of Test Set Embedding by Using Variable-State Skip LFSRs, ResearchGate, May 2008, pp. 1-6.*

Combined Search and Examination Report Under Section 17 and 18(3) for GB Application No. GB1302967.3; Aug. 23, 2013, 8 pp.

* cited by examiner

ACCELERATION OF MEMORY WALKING SEQUENCES DURING SIMULATION

FIELD OF THE INVENTION

The present invention relates generally to computer simulations of integrated circuit designs, and more particularly to accelerating memory walking sequences during computer simulation and verification of a microprocessor design before fabrication.

BACKGROUND

Simulating and verifying the functionalities of a microprocessor design or other integrated circuit design before fabrication ("pre-silicon") are important steps for ensuring that the fabricated design will perform properly. Industry competition and other factors can pressure researchers and manufacturers to decrease production cycle times. However, pre-silicon simulation and verification of a design can be time-consuming because of the enormous volume of possible testing scenarios ("test-cases") to explore and the time each test-case can take to simulate.

One aspect of pre-silicon simulation and verification of a microprocessor design involves simulating operations within the memory of the microprocessor, such as fetches from main memory and writes to cache memory. In many of these simulations, one or more memory walking sequences are performed. Modern microprocessor designs typically include mechanisms to perform memory walking sequences in which the microprocessor advances through a target memory, reading one memory location at a time, and potentially performing one or more operations on the entries contained at each of those memory locations. For example, a microprocessor may perform cache walking sequences through a target cache memory, such as cache purge sequences, where the microprocessor reads every cache location in the target cache memory and evicts entries from those cache locations. While memory walking sequences can consume a large number of processor cycles, modern microprocessors are typically capable of performing memory walking sequences quickly on account of their high clock rates.

When conducting pre-silicon simulations of microprocessor designs that include large memories, such as cache or main memories, simulating memory walking sequences through these target memories can consume a large number of simulated processor cycles. However, a simulated microprocessor performing simulated processor cycles is much slower than its hardware counterpart. Conducting pre-silicon simulations to test and verify memory walking sequences and other microprocessor functions that involve their frequent use can therefore take an exceedingly long time, potentially to the extent that the simulations are impracticable to conduct or must be conducted in a limited fashion, both of which risk leaving design problems undiscovered in the pre-silicon stage.

A way to decrease the testing time required to simulate memory walking sequences would be useful.

SUMMARY

Embodiments of the present invention provide a system, method, and program product for accelerating a simulated memory walking sequence during a simulation conducted by a computer. In one embodiment, the method comprises executing a simulation test-case in which testing is constrained to portions of a simulated memory. The method further comprises identifying one or more memory locations in the simulated memory as eligible to contain valid data during execution of the simulation test-case. The method further comprises, subsequent to commencement of the simulated memory walking sequence in which simulated hardware sequentially processes memory locations in the simulated memory, determining whether an identified memory location is within a specified number of memory locations after a memory location to be processed by the simulated hardware. The method further comprises, responsive to an identified memory location being within the specified number of memory locations after the memory location to be processed by the simulated hardware, allowing the simulated hardware to process the memory location. The method further comprises, responsive to an identified memory location not being within the specified number of memory locations after the memory location to be processed by the simulated hardware, advancing the simulated hardware to a subsequent memory location in the simulated memory that is a specified number of memory locations before an identified memory location, and allowing the simulated hardware to process the subsequent memory location.

In another embodiment, the method comprises executing a simulation test-case in which testing is constrained to portions of a simulated memory. The method further comprises identifying one or more memory locations in the simulated memory as eligible to contain valid data during execution of the simulation test-case. The method further comprises, subsequent to commencement of the simulated memory walking sequence in which simulated hardware sequentially processes memory locations in the simulated memory, determining whether a memory location to be processed by the simulated hardware is an identified memory location. The method further comprises, responsive to the memory location to be processed by the simulated hardware being an identified memory location, allowing the simulated hardware to process the memory location. The method further comprises, responsive to the memory location to be processed by the simulated hardware not being an identified memory location, advancing the simulated hardware to an identified memory location and allowing the simulated hardware to process the identified memory location.

DETAILED DESCRIPTION

In brief summary, a preferred embodiment of the present invention is practiced in the context of performing pre-silicon simulation and verification of a microprocessor design in a simulation environment, where the microprocessor design possesses a large target cache and a hardware mechanism to perform cache walking sequences through the target cache. A test-case is described in which, during simulation of the test-case, it is known which portions of the target cache potentially contain valid data.

A conventional cache walking sequence performed during simulation of the test-case would advance sequentially through the target cache, with the simulated microprocessor processing each cache location to determine whether to perform an operation on the entry contained at the cache location and then perform any appropriate operations on the entry. In contrast, in the preferred embodiment of the present invention, the cache walking sequence is accelerated by skipping over portions of the target cache that, based on the test-case being simulated, are known to be vacant. Because the simulated microprocessor only processes cache locations in the target cache known to potentially contain valid data, as opposed to all cache locations in the target cache, the simulation time necessary to complete the cache walking sequence can be reduced.

The term "cache", as used in this specification, refers generally to simulated microprocessor cache memories including, but not limited to, simulated static random access memory such as L1, L2, and L3 caches. While example embodiments of the present invention are described with regard to caches and cache walking sequences, other embodiments can accelerate memory walking sequences through other types of target memories such as, for example, a simulated memory controller performing a memory walking sequence through simulated dual in-line memory modules.

Embodiments of the present invention will now be described in detail with reference to the accompanying drawings.

Figure 1:
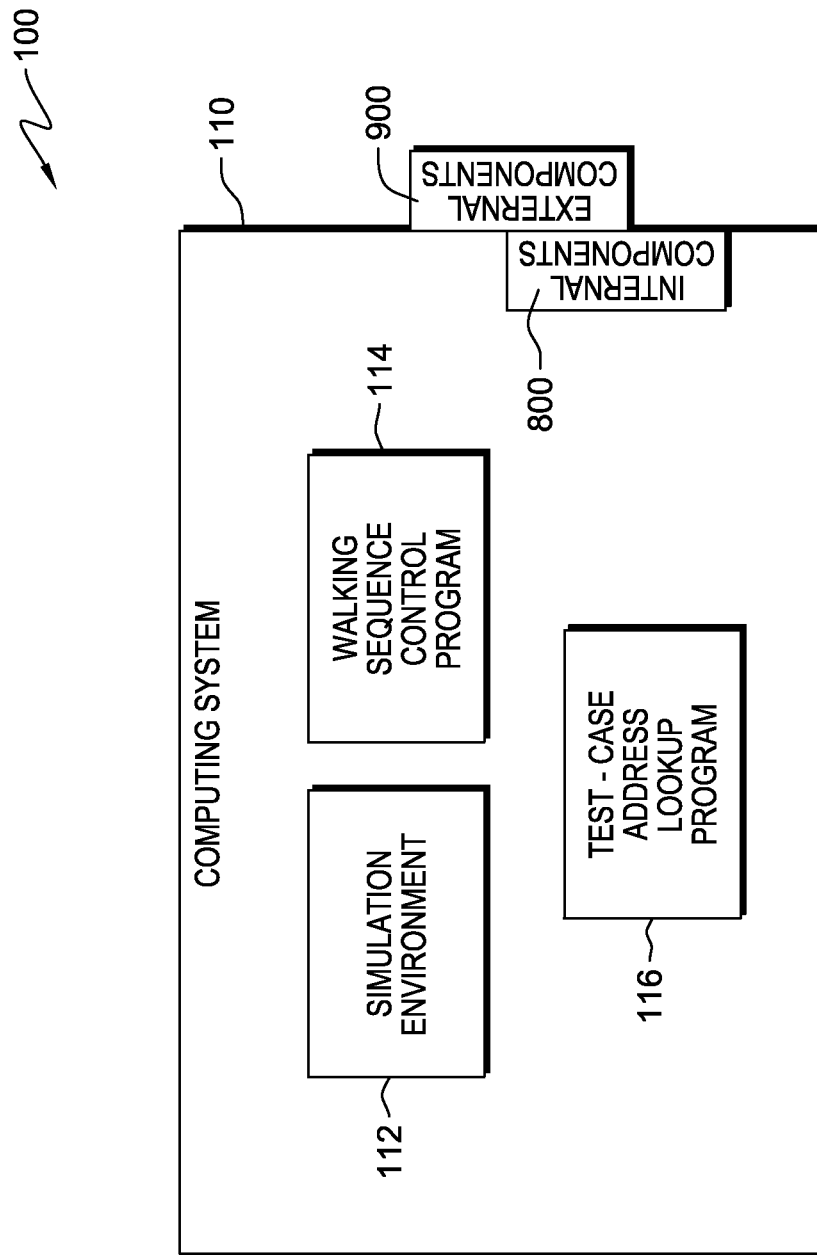
FIG. 1 is a functional block diagram of a simulation system in accordance with an embodiment of the present invention.

FIG. 1 is a functional block diagram of a simulation system 100 in accordance with an embodiment of the present invention. Simulation system 100 includes a computing system 110. Computing system 110 includes a simulation environment 112, a walking sequence control program 114, and a test-case address lookup program 116, which together, enable a user to conduct pre-silicon verification and simulation of integrated circuit designs and accelerate simulated memory walking sequences performed during those simulations in accordance with embodiments of the present invention. Simulation environment 112 is a software simulation environment that includes, for example, a suite of simulation and verification tools that assist a user in conducting pre-silicon simulation and verification of integrated circuit designs. Simulation environment 112 allows a user to load simulation models of integrated circuit designs and simulate operation of those designs in various test-cases. For example, using simulation environment 112, a user can load simulation models of a microprocessor design having a large cache memory and main memory, simulate how the microprocessor fetches main memory entries and writes those entries to the cache memory, and also simulate how the microprocessor performs cache walking sequences. Simulation environment 112 may be implemented using, for example, commercially available tools such as the simulation software packages available from Cadence Design Systems, Inc. of San Jose, Calif. In general, simulation environment 112 can be any software or combination of software that enables a user to model integrated circuit designs and components and simulate test-cases in accordance with embodiments of the present invention.

Walking sequence control program 114 is a software module that is called by simulation environment 112. Walking sequence control program 114 receives information regarding memory walking sequences being performed within simulation environment 112, and operates to skip portions of a target memory that, based on the test-case being simulated, are known to be vacant, as explained in greater detail with regard to FIGS. 4 and 5. Walking sequence control program can be implemented, for example, in the form of a custom module or plug-in for simulation environment 112.

Test-case address lookup program 116 is a software module called by walking sequence control program 114. During a memory walking sequence, test-case address lookup program 116 identifies portions of a target memory that, based on the test-case being simulated, are known to potentially contain valid data, as explained in greater detail with regard to FIGS. 4 and 5. Test-case address lookup program 116 can also be implemented, for example, in the form of a custom module or plug-in for simulation environment 112.

Computing system 110 also includes internal components 800 and external components 900 and can be, for example, a laptop computer, desktop computer, specialized computer server, or any other computer system known in the art. In general, computing system 110 can be any programmable electronic device as described in further detail with regard to FIG. 6 or a combination of such devices. In certain embodiments, computing system 110 represents a computer system utilizing clustered computers and components to act as a single pool of seamless resources when accessed through a network, such as a local area network, a wide area network, or a combination of the two. This implementation may be preferred for data centers and for cloud computing applications.

Figure 2:
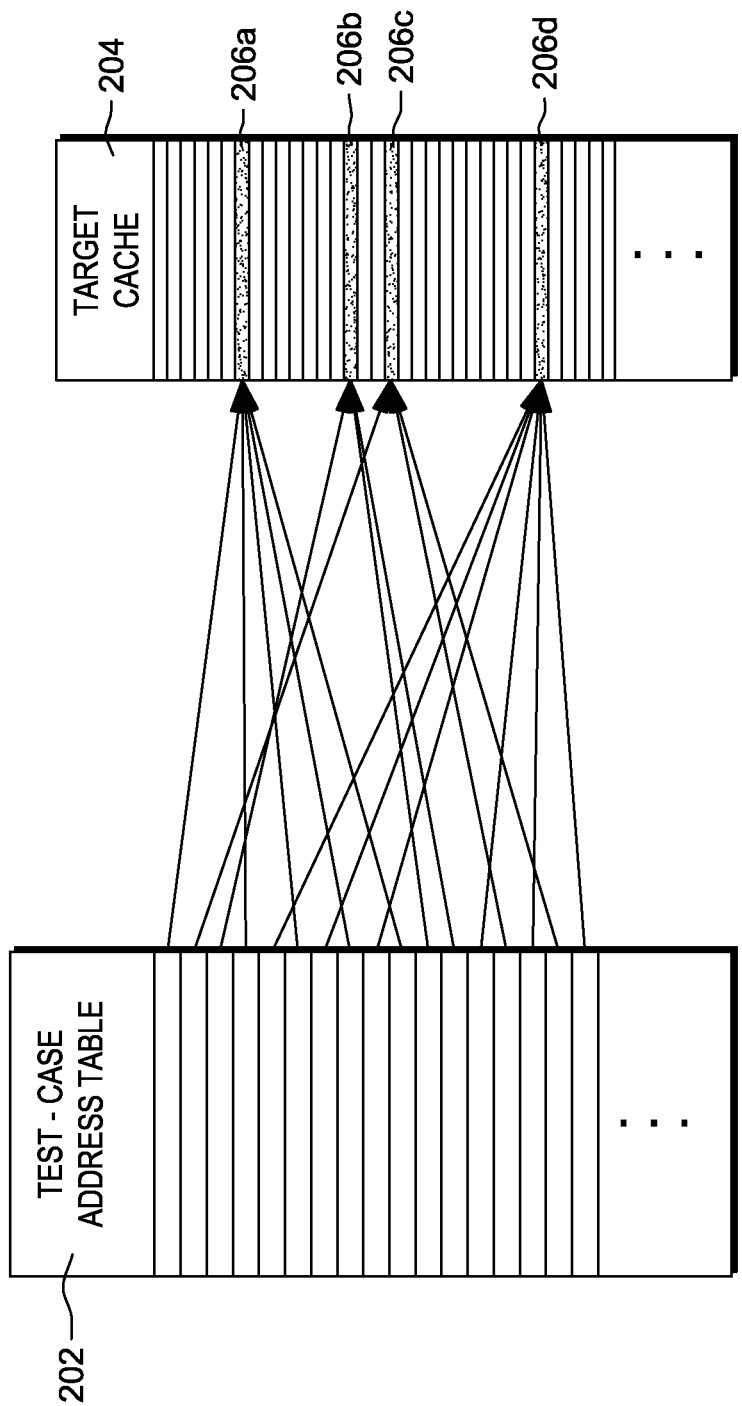
FIG. 2 is a block diagram illustrating a test-case in accordance with an embodiment of the present invention in which it is known which portions of a target cache potentially contain valid data during the course of the simulation.

FIG. 2 is a block diagram illustrating simulation of a test-case in accordance with a preferred embodiment of the present invention in which it is known which portions of a target cache potentially contain valid data during the course of the simulation. In this embodiment, target cache 204 is a simulated cache that is mapped to a simulated main memory in accordance with an n-way set associative cache mapping scheme, which is a cache mapping scheme found in many modern microprocessor designs. In an n-way set associative cache mapping scheme, target cache 204 is divided up into multiple cache sets, each cache set containing n ways, or cache locations in which a main memory entry can be stored. Each memory address in the simulated main memory is mapped to a particular cache set such that, if the simulated microprocessor accesses a particular main memory address, the entry contained at that main memory location can only be stored in the simulated cache at the n cache locations within the cache set to which it is mapped.

In the preferred embodiment, a test-case address table 202 is used to store a relatively small subset of memory addresses of the simulated main memory which have been selected for testing. Cache sets 206a through 206d are cache sets to which at least one selected main memory address in test-case address table 202 is mapped (shown by arrows). It should be noted that FIG. 2 is a simplified illustration of a target cache 204 and a test-case address table 202. Target cache 204 can contain more cache sets and test-case address table 202 can contain more main memory addresses than depicted, as indicated by the ellipses.

In the preferred embodiment, during simulation of the test-case, the simulated microprocessor is instructed to access the simulated main memory addresses contained in test-case address table 202 such that the entries at those main memory locations can be stored in, and evicted from, target cache 204 at the n cache locations within their respective mapped cache sets. Depending on the goals of a particular test-case, a user may select the main memory addresses stored in test-case address table 202, allow the simulation to randomly select them, or use some other selection method. For example, a goal of this example test-case may be to test how a microprocessor design's cache logic behaves when all cache locations in a cache set are occupied with valid data and a victim entry must be chosen for eviction. In such a test-case, a user may wish to select main memory addresses that are known to be mapped to the same cache sets (as shown in FIG. 2, for example) so that the cache sets more quickly become occupied with valid data during the simulation and the cache logic's behavior can be observed.

Irrespective of the main memory address selection method, because an n-way set associative cache scheme is used by the simulated microprocessor in this exemplary embodiment, only those cache sets in target cache 204 which are mapped to at least one of the selected main memory addresses in test-case address table 202 can possibly contain valid data when, during the simulation, the simulated microprocessor accesses those main memory addresses. Thus, during the course of simulating the test-case, there will only be a relatively small number of cache sets whose n cache locations are known to potentially contain valid data (cache sets 206), while the majority of the cache sets in target cache 204 are known to be vacant.

Other embodiments of the present invention involve accelerating memory walking sequences during simulations of test-cases involving other types of target memory. In general, target cache 204 can be any simulated target memory; cache sets 206 can be any portions of that memory to which testing is limited such that memory locations within those portions are known to potentially contain valid data during simulation of a test-case; and test-case address table 202 can store any memory addresses which correspond to or otherwise identify the memory locations known to potentially contain valid data.

Figure 3:
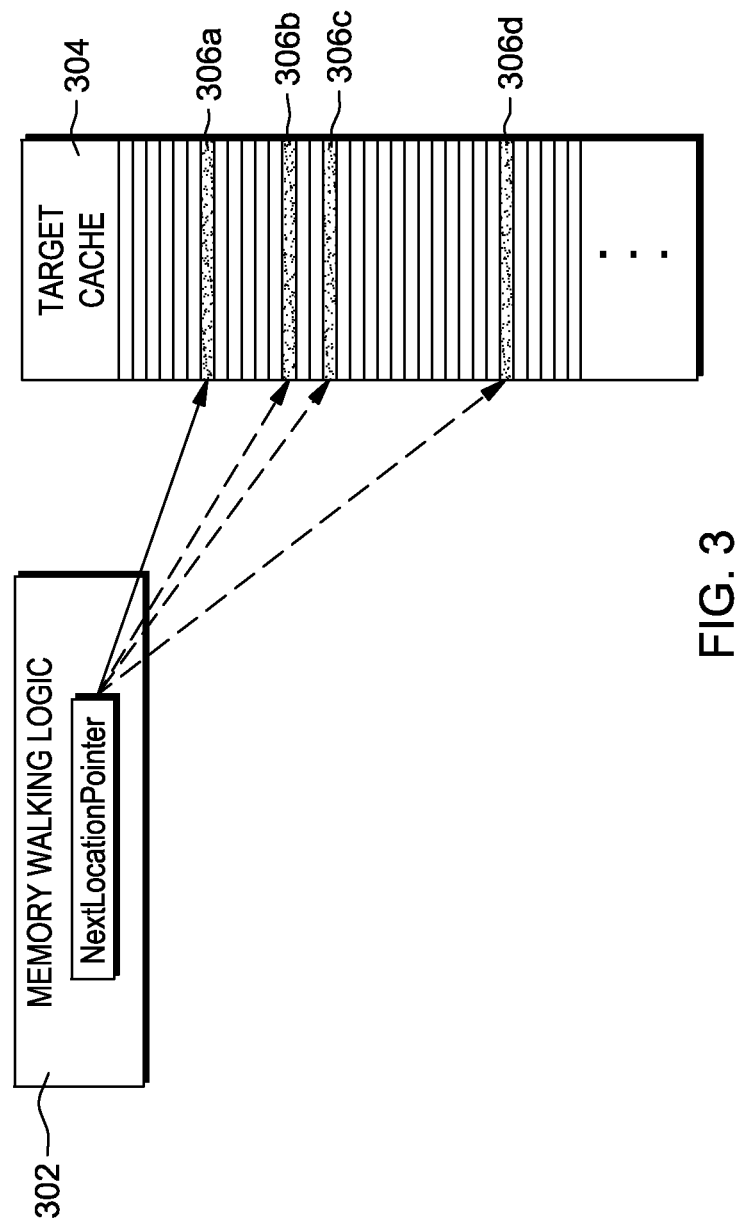
FIG. 3 is a block diagram illustrating an accelerated memory walking sequence in accordance with an embodiment of the present invention.

FIG. 3 is a block diagram illustrating an accelerated memory walking sequence in accordance with an embodiment of the present invention. In the illustrated embodiment, an accelerated cache walking sequence is performed during simulation of a test-case in which the cache sets of a target cache 304 that can potentially contain valid data (cache sets 306a through 306d) are known based on the simulated main memory addresses contained in a test-case address table 202, such as, for example, the test-case discussed with regard to the preferred embodiment in FIG. 2.

During memory walking sequences, generally, the hardware performing the memory walking sequence utilizes a memory walking logic 302. Memory walking logic 302 maintains a register containing a NextLocationPointer instruction which specifies the memory location in a target memory to be processed by the hardware. After processing of a memory location is complete, the NextLocationPointer is incremented to the next subsequent memory location for processing of that memory location, and the procedure is so repeated for all memory locations in the memory. In the example accelerated cache walking sequence depicted in FIG. 3, memory walking logic 302 is controlled by walking sequence control program 114 such that the vacant cache sets of target cache 304 are skipped over and the simulated microprocessor only processes cache locations within cache sets 306. More specifically, based on the selected simulated main memory addresses stored in a test-case address table 202, memory walking logic 302 is controlled by walking sequence control program 114 such that the simulated microprocessor processes cache locations within cache sets to which at least one selected main memory address is mapped (cache sets 306), while skipping over cache locations within cache sets that are not mapped to a selected simulated main memory address.

Figure 4:
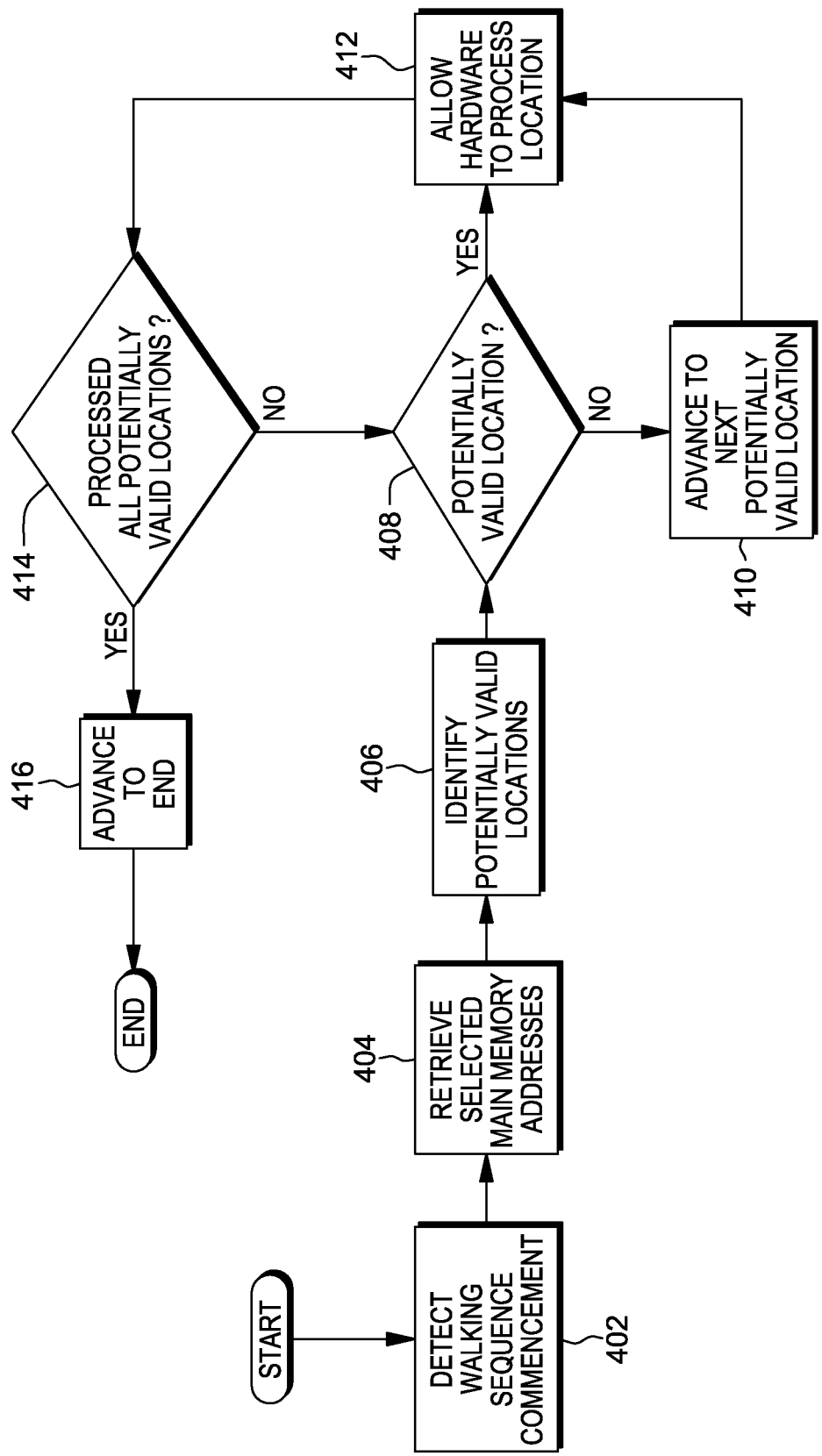
FIG. 4 is a flowchart illustrating the operational steps of an accelerated memory walking sequence in accordance with an embodiment of the present invention.

FIG. 4 is a flowchart illustrating operational steps for a preferred embodiment of the present invention in which a simulated cache walking sequence is accelerated by skipping over all cache locations within vacant cache sets of a target cache. Models are loaded within simulation environment 112 of a microprocessor design possessing a large target cache 304 with an n-way set associative cache mapping scheme to main memory and a hardware mechanism to perform cache walking sequences through the target cache. In this exemplary embodiment, a test-case is simulated within simulation environment 112 in which, based on selected main memory addresses that are contained in a test-case address table 202 and accessed by the simulated microprocessor, it is known which cache sets in target cache 304 potentially contain valid data.

In step 402, walking sequence control program 114 detects the commencement of a simulated cache walking sequence during simulation of the test-case. Walking sequence control program 114 receives from simulation environment 112 the cache location specified by the NextLocationPointer ("pointer location"). Walking sequence control program 114 calls test-case address lookup program 116.

In step 404, test-case address lookup program 116 retrieves from test-case address table 202 the simulated main memory addresses selected for the particular test-case. In step 406, test-case address lookup program 116 identifies the cache locations within the cache sets to which each selected main memory address is mapped ("potentially valid cache locations"). Test-case address lookup program 116 passes this data to walking sequence control program 114.

In step 408, walking sequence control program 114 determines whether the cache location to be processed by the simulated microprocessor is a potentially valid cache location. To do so, walking sequence control program 114 compares the potentially valid cache locations to the pointer location and determines whether one of the potentially valid cache locations matches the pointer location.

If the pointer location does not match a potentially valid cache location, then, in step 410, walking sequence control program 114 sets the NextLocationPointer to the next potentially valid cache location that follows the pointer location. In step 412, walking sequence control program 114 allows the simulated microprocessor to process the new pointer location and then increment the NextLocationPointer to the next subsequent cache location.

If, in step 408, the pointer location does match a potentially valid location, then walking sequence control program 114 does not modify the NextLocationPointer. In step 412, then, walking sequence control program 114 allows the simulated microprocessor to process the current pointer location and then increment the NextLocationPointer to the next subsequent cache location.

In step 414, walking sequence control program 114 determines whether all potentially valid cache locations in target cache 304 have been processed by the simulated microprocessor. For example, walking sequence control program 114 may determine whether there are any potentially valid cache locations that are located after the potentially valid cache location processed in step 412. If walking sequence control program 114 determines that all potentially valid cache locations have not been processed by the simulated microprocessor, then the operational steps repeat back at step 408. If walking sequence control program 114 determines that all potentially valid cache locations have been processed by the simulated microprocessor, then, in step 416, walking sequence control program 114 sets the NextLocationPointer to the last cache location in target cache 304, and the operational steps of this embodiment end.

Figure 5:
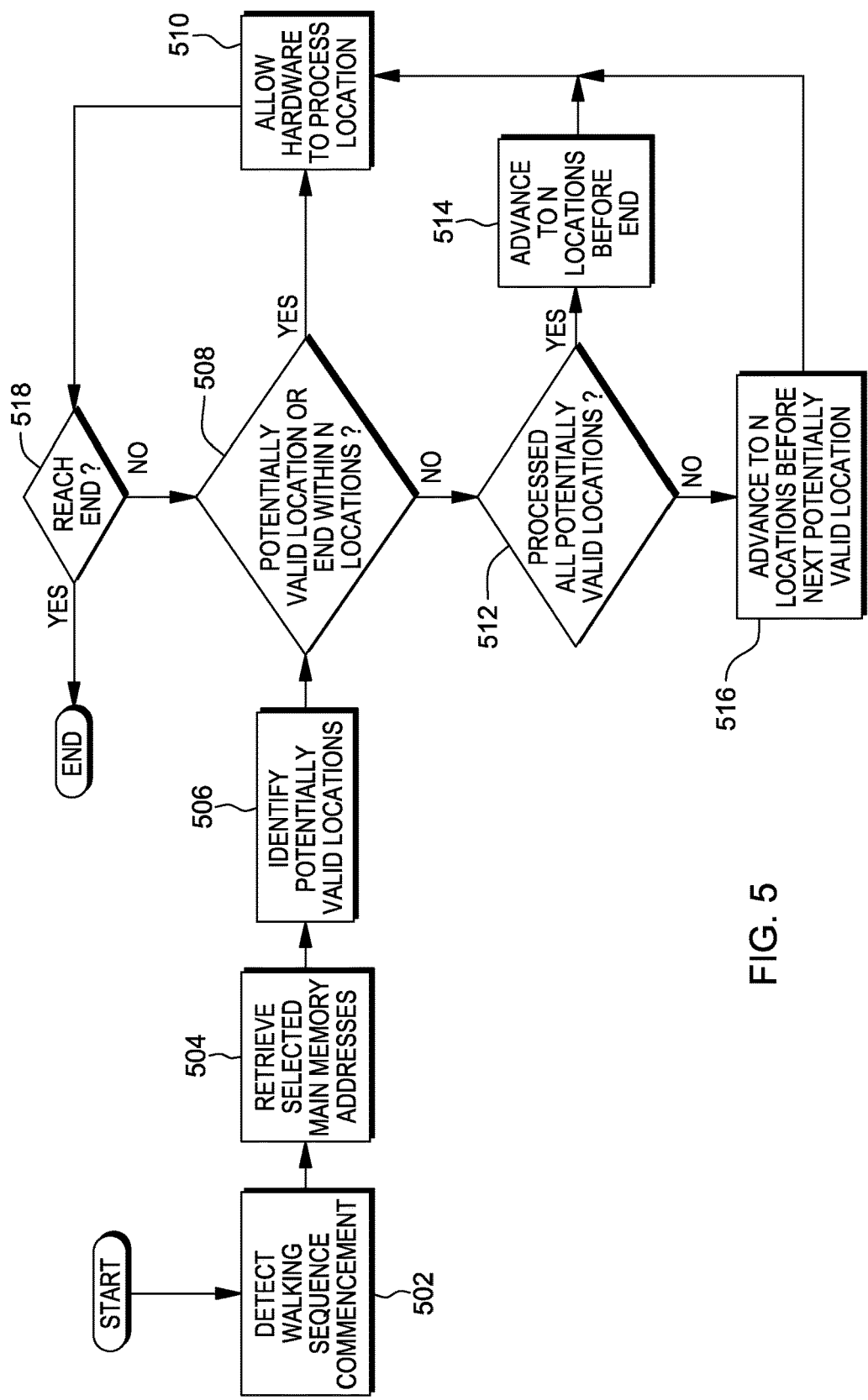
FIG. 5 is a flowchart illustrating the operation steps of an accelerated memory walking sequence in accordance with another embodiment of the present invention.

FIG. 5 is a flowchart illustrating operational steps for an embodiment of the present invention in which a simulated cache walking sequence is accelerated by skipping some cache locations within vacant cache sets of a target cache, as opposed to skipping all cache locations within vacant cache sets. This embodiment is based on the same test-case discussed with regard to FIG. 4, and can be used where a user wishes to accelerate simulated cache walking sequences, but also wishes to test how the simulated microprocessor processes cache locations that are known to not contain valid data. For example, a user may wish to test whether, during a cache walking sequence, the simulated microprocessor properly transitions from processing cache locations that do not contain valid data, to processing cache locations that do contain valid data. Operational steps 502, 504, and 506 are equivalent to operations steps 402, 404, and 406 of FIG. 4, respectively. Accordingly, for an explanation of these operational steps, please refer to the discussion of FIG. 4.

In step 508 of this embodiment, walking sequence control program 114 determines whether a potentially valid cache location or the end of target cache 304 is within a specified number of cache locations after the cache location to be processed by the simulated microprocessor. To do so, walking sequence control program 114 compares the potentially valid cache locations to the pointer location and determines whether a potentially valid cache location or the last cache location in target cache 304 is within a specified number of cache locations after the pointer location. The specified number can be pre-configured by a user.

If a potentially valid cache location or the last cache location in target cache 304 is within the specified number of cache locations after the pointer location, walking sequence control program 114 does not modify the NextLocationPointer. In step 510, then, walking sequence control program 114 allows the simulated microprocessor to process the current pointer location and then increment the NextLocationPointer to the next subsequent cache location.

If a potentially valid cache location or the last cache location in target cache 304 is not within the specified number of cache locations after the pointer location, then, in step 512, walking sequence control program 114 determines whether all potentially valid cache locations have been processed by the simulated microprocessor. For example, walking sequence control program 114 can determine whether there are any potentially valid cache locations that are located after the pointer location.

If walking sequence control program 114 determines that all potentially valid cache locations have been processed by the simulated microprocessor, then, in step 514, walking sequence control program 114 sets the NextLocationPointer to a cache location that is a specified number of cache locations before the last cache location in target cache 304. The specified number, as used in this step, can be equal to the specified number used in step 508. In step 510, then, walking sequence control program 114 allows the simulated microprocessor to process the new pointer location and then increment the NextLocationPointer to the next subsequent cache location.

If, in step 512, walking sequence control program 114 determines that all potentially valid cache locations have not been processed by the simulated microprocessor, then, in step 516, walking sequence control program 114 sets the NextLocationPointer to a cache location that is a specified number of cache locations before the next potentially valid cache location that follows the pointer location. The specified number, as used in this step, can be equal to the specified number used in step 508. In step 510, then, walking sequence control program 114 allows the simulated microprocessor to process the new pointer location and then increment the NextLocationPointer to the next subsequent cache location.

In step 518, walking sequence control program 114 determines whether the simulated cache walking sequence has reached the end of target cache 304. For example, walking sequence control program 114 may determine whether the cache location most recently processed by the simulated microprocessor in step 510 is the last cache location in target cache 304. If walking sequence control program 114 determines that the simulated cache walking sequence has not reached the end of target cache 304, the operational steps of this embodiment repeat back at step 508. If walking sequence control program 114 determines that the simulated cache walking sequence has reached the end of target cache 304, the operational steps of this embodiment end.

Operational steps 402 through 416 of FIG. 4 and operational steps 502 through 518 of FIG. 5 are illustrative of two or more embodiments of the present invention. It should be understood that the content of each step, as well as the order of operation, can be modified without departing from the spirit and intended scope of the present invention. Further, FIGS. 4 and 5 illustrate, and have been explained with regard to, acceleration of a single memory walking sequence. It should be understood that multiple memory walking sequences can be commenced during simulation of a test-case, and each memory walking sequence can be accelerated in accordance with embodiments of the present invention.

Figure 6:
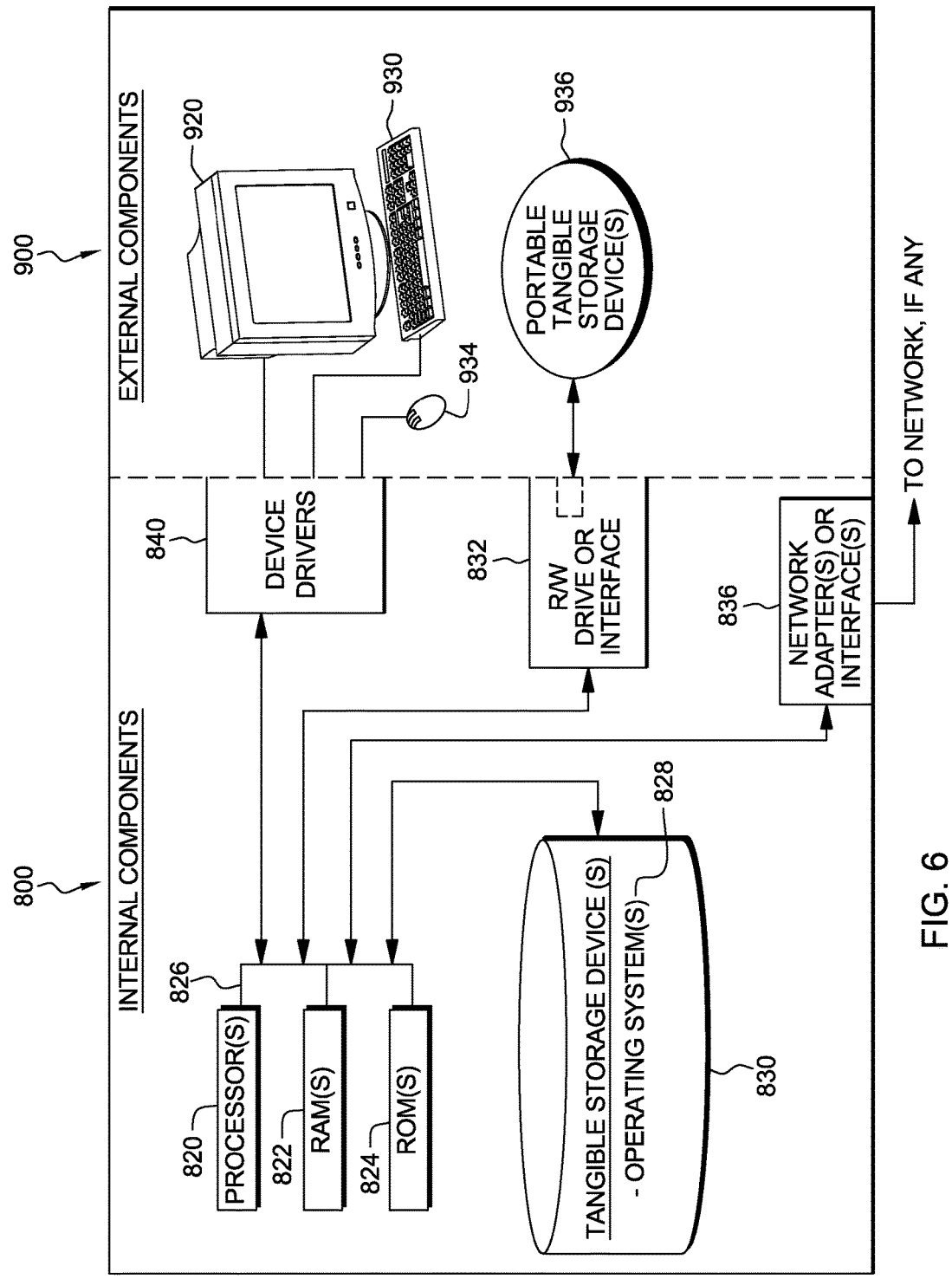
FIG. 6 is a block diagram of hardware and software components within and external to the computing system of FIG. 1 in accordance with an embodiment of the present invention.

FIG. 6 shows a block diagram of internal components 800 and external components 900 of computing system 110 in accordance with an illustrative embodiment of the present invention. It should be appreciated that FIG. 6 provides only an illustration of one implementation and does not imply any limitations with regard to the environments in which different embodiments may be implemented. Many modifications to the depicted environments may be made based on design and implementation requirements.

Computing system 110 having internal components 800 and external components 900 is representative of any electronic device capable of executing machine-readable program instructions. Examples of computing systems, environments, and/or configurations that may be represented by computing system 110 include, but are not limited to, personal computer systems, server computer systems, thin clients, thick clients, laptop devices, multiprocessor systems, microprocessor-based systems, network PCs, minicomputer systems, and distributed cloud computing environments that include any of the above systems or devices.

Internal components 800 includes one or more processors 820, one or more computer-readable RAMs 822 and one or more computer-readable ROMs 824 on one or more buses 826, one or more operating systems 828, and one or more computer-readable tangible storage devices 830. The one or more operating systems 828, simulation environment 112, and programs 114 and 116 in computing system 110 are stored on one or more of the respective computer-readable tangible storage devices 830 for execution by one or more of the respective processors 820 via one or more of the respective RAMs 822 (which typically include cache memory). In the embodiment illustrated in FIG. 6, each of the computer-readable tangible storage devices 830 is a magnetic disk storage device of an internal hard drive. Alternatively, each of the computer-readable tangible storage devices 830 is a semiconductor storage device such as ROM 824, EPROM, flash memory or any other computer-readable tangible storage device that can store a computer program and digital information.

Internal components 800 also includes a R/W drive or interface 832 to read from and write to one or more portable computer-readable tangible storage devices 936 such as a CD-ROM, DVD, memory stick, magnetic tape, magnetic disk, optical disk or semiconductor storage device. Simulation environment 112 and programs 114 and 116 in computing system 110 can be stored on one or more of the respective portable computer-readable tangible storage devices 936, read via the respective R/W drive or interface 832, and loaded into the respective tangible storage devices 830.

Internal components 800 also includes network adapters or interfaces 836 such as a TCP/IP adapter cards, wireless wi-fi interface cards, or 3G or 4G wireless interface cards or other wired or wireless communication links. Simulation environment 112 and programs 114 and 116 in computing system 110 can be downloaded to computing system 110 from an external computer via a network (for example, the Internet, a local area network or other wide area network) and respective network adapters or interfaces 836. From the network adapters or interfaces 836, simulation environment 112 and programs 114 and 116 in computing system 110 are loaded into tangible storage devices 830. The network may comprise copper wires, optical fibers, wireless transmission, routers, firewalls, switches, gateway computers and/or edge servers.

External components 900 can include a computer display monitor 920, a keyboard 930, and a computer mouse 934. External components 900 can also include touch screens, virtual keyboards, touch pads, pointing devices, and other human interface devices. Internal components 800 includes device drivers 840 to interface to computer display monitor 920, keyboard 930 and computer mouse 934. The device drivers 840, R/W drive or interface 832 and network adapter or interface 836 comprise hardware and software (stored in tangible storage devices 830 and/or ROM 824).

Aspects of the present invention have been described with respect to block diagrams and/or flowchart illustrations of methods, apparatus (system), and computer program products according to embodiments of the invention. It will be understood that each block of the flowchart illustrations and/or block diagrams, and combinations of blocks in the flowchart illustrations and/or block diagrams, can be implemented by computer instructions. These computer instructions may be provided to a processor of a general purpose computer, special purpose computer, or other programmable data processing apparatus to produce a machine, such that instructions, which execute via the processor of the computer or other programmable data processing apparatus, create means for implementing the functions/acts specified in the flowchart and/or block diagram block or blocks.

The aforementioned programs can be written in any combination of one or more programming languages, including low-level, high-level, object-oriented or non object-oriented languages, such as Java, Smalltalk, C, and C++. The program code may execute entirely on a user's computer, partly on a user's computer, as a stand-alone software package, partly on a user's computer and partly on a remote computer, or entirely on a remote computer or server. In the latter scenario, the remote computer may be connected to the user's computer through any type of network, including a local area network (LAN) or a wide area network (WAN), or the connection may be made to an external computer (for example, through the Internet using an Internet service provider). Alternatively, the functions of the aforementioned programs can be implemented in whole or in part by computer circuits and other hardware (not shown).

The foregoing description of various embodiments of the present invention has been presented for purposes of illustration and description. It is not intended to be exhaustive nor limit the invention to the precise form disclosed. Many modifications and variations of the present invention are possible. Such modifications and variations that may be apparent to a person skilled in the art of the invention are intended to be included within the scope of the invention as defined by the accompanying claims.

What is claimed is:

1. A method for accelerating a simulated memory walking sequence during a simulation conducted by a computer, the method comprising:

executing, by a computer, a simulation test-case;

creating, by the computer, a test-case memory address table comprising memory addresses of a first simulated memory, wherein each memory address of the first simulated memory is associated with one or more memory locations in a second simulated memory;

for each memory address in the test-case memory address table, identifying, by the computer, each memory location of the respectively associated one or more memory locations as a memory location in the second simulated memory that is eligible to contain valid data during execution of the simulation test-case based on an association with the respective memory address in the test-case memory address table, wherein the second simulated memory includes a plurality of memory locations that are not associated with at least one memory address in the first simulated memory and are thus known to be vacant during execution of the simulation test-case;

detecting, by the computer, during execution of the simulation test-case a simulated memory walking sequence being commenced by the simulated hardware, wherein the simulated hardware is configured to perform the simulated memory walking sequence by sequentially processing each memory location in the second simulated memory; and responsive to detecting, by the computer, the simulated memory walking sequence being commenced by the simulated hardware, the computer executing walking-sequence control logic to modify the simulated memory walking sequence responsive to comparing each memory location in the second simulated memory to a predetermined set of memory locations in the second simulated memory identified as eligible to contain valid data during execution of the simulation test-case, the walking-sequence control logic causing the simulated hardware to:
  process each identified memory location that is eligible to contain valid data;
  process one or more of memory locations that are known to be vacant during execution of the simulation test-case and are included in the plurality of memory locations that are not associated with at least one memory address in the first simulated memory, the walking-sequence control logic selecting memory locations known to be vacant for processing based on or more rules; and
  skip at least one memory location known to be vacant in the second simulated memory during execution of the simulation test-case and included in the plurality of memory locations that are not associated with at least one memory address in the first simulated memory.

2. The method of claim 1, wherein the simulated hardware comprises one or more simulated microprocessor components.

3. The method of claim 1, wherein the second simulated memory is a simulated cache memory.

4. The method of claim 1, wherein controlling the logic of the simulated hardware comprises:
  the computer identifying a memory location to be processed by the simulated hardware in the simulated memory walking sequence by reading a pointer instruction in a register maintained by the logic which specifies the memory location to be processed;
  responsive to determining, by the computer, that a memory location of the one or more memory locations in the second simulated memory identified as being eligible to contain valid data is within a specified number of memory locations after the memory location to be processed, the computer allowing the simulated hardware to process the memory location to be processed and allowing the simulated hardware to increment the pointer instruction to a next subsequent memory location following the memory location to be processed; and
  responsive to determining, by the computer, that a memory location of the one or more memory locations in the second simulated memory identified as eligible to contain valid data is not within the specified number of memory locations after the memory location to be processed, the computer setting the pointer instruction to a subsequent memory location in the second simulated memory that is one of the one or more memory locations that are known to be vacant and is located before a memory location of the one or more memory locations in the second simulated memory identified as being eligible to contain valid data, and the computer allowing the simulated hardware to process the subsequent memory location and allowing the simulated hardware to increment the pointer instruction to a next subsequent memory location following the subsequent memory location.

5. The method of claim 1, wherein the first simulated memory is a simulated main memory and the second simulated memory is a simulated cache memory, the one or more memory locations in the second simulated memory comprising one or more respective cache locations.

6. The method of claim 5, wherein the simulated cache memory comprises one or more cache sets, each cache set comprising one or more respective cache lines, and wherein each memory address of the simulated main memory is associated with one or more respective cache sets such that each memory address in the simulated main memory can only store data at cache locations of the associated one or more respective cache sets.

7. The method of claim 5, wherein the one or more memory locations that a known to be vacant during execution of the simulated test-case are cache lines that do not comprise cache sets that are associated with at least one memory address in the simulated main memory.

8. The method of claim 1, wherein the computer executing walking-sequence control logic compares each memory location in the second simulated memory to each identified memory location that is eligible to contain valid data during execution of the simulation test-case prior to accessing any location in the simulated second memory.

9. A method for accelerating a simulated memory walking sequence during a simulation conducted by a computer, the method comprising:
  executing, by a computer, a simulation test case;
  creating, by the computer, a test-case memory address table comprising memory addresses of a first simulated memory, wherein each memory address of the first simulated memory is associated with one or more memory locations in a second simulated memory;
  for each memory address in the test-case memory address table, identifying, by the computer, each memory location of the respectively associated one or more memory locations as a memory location in the second simulated memory that is eligible to contain valid data during execution of the simulation test-case based on an association with the respective memory address in the test-case memory address table, wherein the second simulated memory includes at least one memory location that is not associated with at least one memory address in the first simulated memory and is thus known to be vacant during execution of the simulation test-case;
  detecting, by the computer, during execution of the simulation test-case, a simulated memory walking sequence being commenced by the simulated hardware, wherein the simulated hardware is configured to perform the simulated memory walking sequence by sequentially processing each memory location in the second simulated memory; and
  responsive to detecting, by the computer, the simulated memory walking sequence being commenced by the simulated hardware, the computer executing walking-sequence control logic to modify the simulated memory walking sequence responsive to comparing each memory location in the second simulated memory to a predetermined set of memory locations in the second simulated memory identified as eligible to contain valid data during execution of the simulation test-case, the walking-sequence control logic causing the simulated hardware to:
    process each identified memory location that is eligible to contain valid data; and
    skip each memory location known to be vacant in the second simulated memory during execution of the simulation test-case and included in the at least one memory location that is not associated with at least one memory address in the first simulated memory.

10. The method of claim 9, wherein the simulated hardware comprises one or more simulated microprocessor components.

11. The method of claim 9, wherein the second simulated memory is a simulated cache memory.

12. The method of claim 9, wherein controlling the logic of the simulated hardware comprises:
the computer identifying a memory location to be processed by the simulated hardware in the simulated memory walking sequence by reading a pointer instruction in a register maintained by the logic which specifies the memory location to be processed;
responsive to determining, by the computer, that the memory location to be processed is one of the one or more memory locations in the second simulated memory identified as being eligible to contain valid data, the computer allowing the simulated hardware to process the memory location to be processed and allowing the simulated hardware to increment the pointer instruction to a next subsequent memory location following the memory location to be processed; and
responsive to determining, by the computer, that the memory location to be processed is one of the one or more memory locations in the second simulated memory that are known to be vacant, the computer setting the pointer instruction to a subsequent memory location in the simulated memory that is one of the one or more memory locations in the second simulated memory identified as being eligible to contain valid data, and the computer allowing the simulated hardware to process the subsequent memory location and allowing the simulated hardware to increment the pointer instruction to a next subsequent memory location following the subsequent memory location.

13. A computer program product for accelerating a simulated memory walking sequence during a simulation conducted by a computer, the computer program product comprising:
one or more non-transitory computer-readable tangible storage devices and program instructions stored on at least one of the one or more storage devices, the program instructions comprising:
program instructions to execute, by a computer, a simulation test-case;
program instructions to create, by the computer, a test-case memory address table comprising memory addresses of a first simulated memory, wherein each memory address of the first simulated memory is associated with one or more memory addresses in a second simulated memory;
program instructions to, for each memory address in the test-case memory address table, identify, by the computer, each memory location of the respectively associated one or more memory locations as a memory location in the second simulated memory that is eligible to contain valid data during execution of the simulation test-case based on an association with the respective memory address in the test-case memory address table, wherein the second simulated memory includes a plurality of memory locations that are not associated with at least one memory address in the first simulated memory and are thus known to be vacant during execution of the simulation test-case;
program instructions to detect, by the computer, during execution of the simulation test-case, that an operation of the one or more operations performed by the simulated hardware is commencement of a simulated memory walking sequence by the simulated hardware, wherein the simulated hardware is configured to perform the simulated memory walking sequence by sequentially processing each memory location in the second simulated memory; and
program instructions to, responsive to detecting, by the computer, the commencement of the simulated memory walking sequence by the simulated hardware, execute, by the computer, walking-sequence control logic to modify the simulated memory walking sequence responsive to executing program instructions to compare each memory location in the second simulated memory to a predetermined set of memory locations in the second simulated memory identified as eligible to contain valid data during execution of the simulation test-case, the walking-sequence control logic causing the simulated hardware to:
process each identified memory location that is eligible to contain valid data;
process one or more of memory locations that are known to be vacant during execution of the simulation test-case and are included in the plurality of memory locations that are not associated with at least one memory address in the first simulated memory, the walking-sequence control logic selecting memory locations known to be vacant for processing based on or more rules; and
skip at least one memory location known to be vacant in the second simulated memory during execution of the simulation test-case and included in the plurality of memory locations that are not associated with at least one memory address in the first simulated memory.

14. The computer program product of claim 13, wherein the simulated hardware comprises one or more simulated microprocessor components.

15. The computer program product of claim 13, wherein the second simulated memory is a simulated cache memory.

16. The computer program product of claim 13, wherein the program instructions to accelerate the simulated walking sequence by controlling a logic of the simulated hardware comprise:
program instructions to identify, by the computer, a memory location to be processed by the simulated hardware in the simulated memory walking sequence by reading a pointer instruction in a register maintained by the logic which specifies the memory location to be processed;
program instructions to, responsive to determining, by the computer, that a memory location of the one or more memory locations in the second simulated memory identified as being eligible to contain valid data is within a specified number of memory locations after the memory location to be processed, allow, by the computer, the simulated hardware to process the memory location to be processed and increment the pointer instruction to a next subsequent memory location following the memory location to be processed; and
program instructions to, responsive to determining, by the computer, that a memory location of the one or more memory locations in the second simulated memory identified as eligible to contain valid data is not within the specified number of memory locations after the memory location to be processed, set, by the computer, the pointer instruction to a subsequent memory location in the second simulated memory that is one of the one or more memory locations that are known to be vacant and is located before a memory location of the one or more memory locations in the second simulated memory identified as eligible to contain valid data, and allow, by the computer, the simulated hardware to process the subsequent memory location and increment the pointer instruction to a next subsequent memory location following the subsequent memory location.

17. A computer program product for accelerating a simulated memory walking sequence during a simulation conducted by a computer, the computer program product comprising:
one or more non-transitory computer-readable tangible storage devices and program instructions stored on at least one of the one or more storage devices, the program instructions comprising:
program instructions to execute, by a computer, a simulation test-case;
program instructions to create, by the computer, a test-case memory address table comprising memory addresses of a first simulated memory, wherein each memory address of the first simulated memory is associated with one or more memory addresses in a second simulated memory;
program instructions to, for each memory address in the test-case memory address table, identify, by the computer, each memory location of the respectively associated one or more memory locations as a memory location in the second simulated memory that is eligible to contain valid data during execution of the simulation test-case based on an association with the respective memory address in the test-case memory address table, wherein the second simulated memory includes at least one memory location that is not associated with at least one memory address in the first simulated memory and is thus known to be vacant during execution of the simulation test-case;
program instructions to detect, by the computer, during execution of the simulation test-case, a simulated memory walking sequence being commenced by the simulated hardware, wherein the simulated hardware is configured to perform the simulated memory walking sequence by sequentially processing each memory location in the second simulated memory; and
program instructions to, responsive to detecting, by the computer, the simulated memory walking sequence being commenced by the simulated hardware, execute, by the computer, walking-sequence control logic to modify the simulated memory walking sequence responsive to comparing each memory location in the second simulated memory to a predetermined set of memory locations in the second simulated memory identified as eligible to contain valid data during execution of the simulation test-case, the walking-sequence control logic causing the simulated hardware to:
process each identified memory location that is eligible to contain valid data; and
skip each memory location known to be vacant in the second simulated memory during execution of the simulation test-case and included in the at least one memory location that is not associated with at least one memory address in the first simulated memory.

18. The computer program product of claim 17, wherein the simulated hardware comprises one or more simulated microprocessor components.

19. The computer program product of claim 17, wherein the second simulated memory is a simulated cache memory.

20. The computer program product of claim 17, wherein the program instructions to accelerate the simulated walking sequence by controlling a logic of the simulated hardware comprise:
program instructions to identify, by the computer, a memory location to be processed by the simulated hardware in the simulated memory walking sequence by reading a pointer instruction in a register maintained by the logic which specifies the memory location to be processed;
program instructions to, responsive to determining, by the computer, that the memory location to be processed is one of the one or more memory locations in the second simulated memory identified as being eligible to contain valid data, allow, by the computer, the simulated hardware to process the memory location to be processed and increment the pointer instruction to a next subsequent memory location following the memory location to be processed; and
program instructions to, responsive to determining, by the computer, that the memory location to be processed is one of the one or more memory locations in the second simulated memory that are known to be vacant, set, by the computer, the pointer instruction to a subsequent memory location in the second simulated memory that is one of the one or more memory locations in the second simulated memory identified as being eligible to contain valid data, and allow, by the computer, the simulated hardware to process the subsequent memory location and increment the pointer instruction to a next subsequent memory location following the subsequent memory location.

* * * * *